United States Patent [19]

Thulke

[11] Patent Number: 5,027,364
[45] Date of Patent: Jun. 25, 1991

[54] LASER DIODE WITH BURIED ACTIVE LAYER AND LATERAL CURRENT LIMITATION

[75] Inventor: Wolfgang Thulke, Munich, Fed. Rep. of Germany

[73] Assignee: Siemens Aktiengesellschaft, Munich, Fed. Rep. of Germany

[21] Appl. No.: 455,411

[22] PCT Filed: Apr. 18, 1988

[86] PCT No.: PCT/DE88/00234
§ 371 Date: Dec. 18, 1989
§ 102(e) Date: Dec. 18, 1989

[87] PCT Pub. No.: WO88/08215
PCT Pub. Date: Oct. 20, 1988

[30] Foreign Application Priority Data

Apr. 16, 1987 [DE] Fed. Rep. of Germany ....... 3713045
Apr. 16, 1987 [DE] Fed. Rep. of Germany ....... 3713133

[51] Int. Cl.$^5$ ............................................. H02S 3/19
[52] U.S. Cl. .................................................. 372/46
[58] Field of Search ............................ 372/46, 44, 45

[56] References Cited

U.S. PATENT DOCUMENTS 4,236,122 11/1980 Cho et al. ............................ 372/50
4,620,307 10/1986 Kappeler ............................. 372/50

FOREIGN PATENT DOCUMENTS 0206851 12/1986 European Pat. Off. .
0208209 1/1987 European Pat. Off. .
2156584A 10/1985 United Kingdom .
2156585A 10/1985 United Kingdom .
2175442A 11/1986 United Kingdom .

OTHER PUBLICATIONS

IEEE Journal of Quantum Electronics QE-22 (1986) Jun., No. 6, "High-Speed InGaAsP Constricted-Mesa Lasers", pp. 833-843.
IEEE Journal of Quantum Electronics QE-21 (1985) Jun., No. 6, "Three-and Four Layer LPE InGaAs (P) Mushroom Stripe Lasers", pp. 650-657.
G. Winstel, C. Weyrich: Optoelektronik I, Berlin 1980, pp. 225-232, Springer-Verlag, Berlin, Heidelberg, New York 1980.
IEEE Journal of Quantum Electronics QE-16 (1980) Feb., No. 2, "Fabrication and Lasing Properties of Mesa Substrate . . . ", pp. 160-164.
Appl. Phys. Letter, 42(5), pp. 403-405 (1983) Koren et al., "InGaAsP/InP Undercut Mesa Laser with Planar Polyimide Passivation".
Japanese Journal of Applied Physics 19, pp. L775-L776 (1980), Chen et al., "A New GaInAsP/InP T-Laser at 1.2 $\mu$m Fabricated on Semi-Insulating Substrate".
Electronics Letter 21, pp. 297-299 No. 7, Mar. 1985, Bowers et al., "High-Frequency Modulation of 1.52 $\mu$m Vapor-Phase-Transported InGaAsP Lasers".
Electronics Letter 21, pp. 392-393, No. 9, Apr. 1985, Bowers et al., "High-Frequency Modulation of 1.52 $\mu$m Vapor-Phase-Transported InGaAsP Lasers".
Bulletin Feb. 12, 1987, vol. 11, No. 46 (E-479) (2493).

Primary Examiner—James W. Davie
Attorney, Agent, or Firm—Hill, Van Santen, Steadman & Simpson

[57] ABSTRACT

Laser diode with BH double hetero-structure and lateral channels for lateral current limitation, whereby the laser-active stripes are provided with lateral spacer layers and these spacer layers are fashioned before the etching of the lateral channels of a semiconductor material that cannot be attached by the etchant, so that the laser-active stripes have an undamaged, straight line, lateral limitation. This laser diode has a low threshold current and a high differential efficiency given a high output power. Parasitic capacitances are voided by transverse channels and a structured metal contact.

10 Claims, 4 Drawing Sheets

LASER DIODE WITH BURIED ACTIVE LAYER AND LATERAL CURRENT LIMITATION

BACKGROUND OF THE INVENTION

The invention is directed to a laser diode with buried active layer and lateral current limitation and is also directed to a method for the manufacture thereof.

Field of the Invention

It is known to manufacture laser diodes having low threshold current and high differential efficiency as buried double hetero-structure lasers (BH) even given high output power. (See, for example, G. Winstel, C. Weyrich, Optoelektronik 1, Springer Verlag, Berlin, Heidelberg, N.Y., 1980, Pages 225 through 232). The active layer of this laser in the form of a narrow stripe is embedded in a semiconductor material having a low refractive index and a higher energy band gap. The double hetero-structure and the embedding of the active layer produce a low threshold current and a guidance of the beam in transverse and in lateral direction, so that the losses of the laser power due to diffraction in passive regions are kept low. The efficiency is increased by lateral current limitation to the narrow region of the active layer insofar as possible. A shunt current flows outside the active layer and a high output power is not achieved given incomplete lateral current limitation, for example, only due to the different threshold voltages of the hetero-pn-junction and of the homo-pn-junction. High output powers can be achieved by additional pn-junctions polarized in non-conducting direction laterally of the active stripe. The pn-junctions, however, represent additional parasitic capacitances that deteriorate the modulation behavior of the laser diode.

It is known to reduce shunt currents and parasitic capacitances in that the effective areas of the corresponding pn-junctions are reduced. For example, this occurs by etching the corresponding layers off or in that these layers are separated from the current-carrying region by etching channels. The structures resulting therefrom are not planar, this being unfavorable for manufacture and later mounting.

The publication of H. Burkhard and E. Kuphal, "Three-and Four-Layer LPE InGaAs (P) Mushroom Stripe Lasers for $\lambda=1.30$, 1.54, and 1.66 um", in IEEE Journal of Quantum Electronics QE-21, 650–657 (1985) discloses a laser structure wherein channels are etched into the semiconductor material laterally of the active stripe. This structure is not a matter of a planar structure; rather, a mesa is etched onto the substrate surface and, subsequently, channels are etched out laterally of an active stripe by lateral attack of an etchant and the lower edge of this mesa. The dimensioning and lateral limitation of the active stripe is defined by the etching process. The channels are subsequently filled up with phosphorous silicate glass.

A further possibility for reducing the effective surfaces is to increase the specific resistance of the semiconductor material outside the current-carrying region, for example, by implantation of protons. The obtainable values are limited by the increase in resistance that can be achieved. One disadvantage of this method is that the resistance can again be reduced by curing of the crystal structure under the influence of heat.

SUMMARY OF THE INVENTION

It is an object of the present invention to specify an easily manufacturable BH-laser diode having specify an easily manufacturable BH-laser diode having low threshold current and high differential efficiency in planar structure even given high output power and to specify a method for the manufacture thereof.

This object is achieved with a laser diode having lateral etched channels provided laterally of an active stripe and proceeding parallel thereto, the active stripe being laterally limited by semiconductor material, and the lateral limitation of the active stripe proceeding in as straight a line as possible using semi-conductor layers manufactured with mask techniques and the method achieved by implementing the following steps:

(a) applying an active layer onto a basic structure that contains at least one substrate and a buffer layer composed of a first semi-conductor material;

(b) applying an upper layer onto the active layer;

(c) etching the active layer and the upper layer down with the assistance of a mask to form an active stripe and an upper stripe;

(d) applying spacer layers to the sidewalls of the active stripe and of the upper stripe;

(e) applying an intermediate later laterally for the spacer layer, the intermediate layer having at least the thickness of the stripe at the sidewalls of the spacer layers and being composed of a material that can be removed with an etchant that does not attack the material of the spacer layer;

(f) applying a cover layer onto the intermediate layer;

(g) applying a contact layer onto the cover layer;

(h) etching the contact layer down to form a contact stripe with the assistance of a mask so that the active stripe lies in the shadow of the contact stripe;

(i) etching transverse channels that proceed perpendicularly relative to the layers laterally of the contact stripe into the cover layer down to the intermediate layer with the assistance of a mask;

(j) etching off the intermediate layer up to the spacer layers with a selectively acting etchant so that lateral channels derive; and (k) providing the laser diode with a structured metal contact at the side facing away from the substrate, the metal contact entirely covering the contact stripe and leaving the transverse channels open and allowing a contacting of the laser diode on contacting surfaces outside the region of the contact stripe.

Further developments of the invention are provided by the above-described laser diode which is further characterized by the semiconductor material that laterally limits the active stripe being fashioned as spacer layers; the lateral channels being fashioned in semiconductor material that is grown laterally adjacent in an outward direction at the spacer layers; and the spacer layers being of a semiconductor material that is not attacked by at least one substance employable for the selective etching of the lateral channels. This laser diode is further defined in that at least one active stripe is applied on a basic structure that contains at least one substrate and the buffer layer composed of a first semiconductor material and an upper stripe is applied on the at least one active stripe; spacer layers that respectively completely cover the sidewalls of the active stripe are applied onto the sidewalls of every active stripe and of the appertaining upper stripe; the lateral channels that proceed parallel to the active strip are etched out laterally adjacent to the spacer layers; these lateral channels are limited toward the outside by ridges; the laser diode is planarized with a cover layer; a contact stripe is applied above the active strip; and the surface of the contact stripe and of the cover layer are covered with a structured metal contact that comprises at least one contacting surface outside of the region occupied by the contact stripe.

In the laser diode, the spacer layers may be composed of the same semiconductor material as the cover layer. Furthermore, the spacer layers can extend at most up to the upper boundary of the upper stripe. Further improvements are provided by the laser diode in which the substrate is structured, or non-planar; the structuring of this substrate is exploited in that an active layer is grown in such manner that the active layer is fashioned with an active stripe that proceeds along the structuring of the substrate and is fashioned with lateral regions separated therefrom; the semiconductor material that laterally limits the active stripe is the semiconductor material of the cover layer; the cover layer is composed of a semiconductor material that is not attacked by at least one substance employable as a selective etchant for the lateral channels; and the lateral channels are formed in the lateral regions of the active layer.

This laser diode is further characterized by the buffer layer, the active layer and the cover layer being applied onto the structured, or non-planar, substrate; the active layer being formed as at least one active stripe on the structured substrate and as lateral regions whereby the sidewalls of the structuring are not covered; the lateral channels extend up to the sidewalls of the structuring and are fashioned laterally of every active stripe; and at least one part of these lateral channels are outwardly limited by ridges and by potentially further sidewalls of structuring proceeding parallel to the active stripes; the laser diode is planarized with a cover layer; a contact stripe is applied above every active stripe; and the surface of the contact stripe and of the cover layer is provided with a structured metal contact that comprises at least one contacting surface outside of the region occupied by the contact stripe.

The foregoing laser diode may be characterized by the structuring of the substrate being composed of at least one trench; or alternately being composed of at least one ridge.

Preferred developments of the laser diode include the substrate being composed of a semiinsulating material; the buffer layer being provided with a further metal contact in a lateral region that lies outside of the region occupied by the laser active stripe and that is left free by the cover layer.

The above-described method of the invention is further characterized by the step (i) further including using a structured metal contact that entirely covers the contact stripe and allows a contacting of the laser diode on the contacting surfaces outside the region of the contact stripe as a mask, and omitting the step (k).

The method for manufacturing a laser diode of a preferred embodiment includes;

(a) applying a buffer layer, an active layer, and an upper layer onto a substrate;

(b) etching parallel trenches into the upper layer and into the active layer down to the buffer layer so that the active layer and the upper layer remain standing between the parallel trenches as an active stripe and as an upper stripe;

(c) growing a cover layer over the structure such that the parallel trenches are filled with spacer layers and such that the structure is coated;

(d) applying a contact layer onto the cover layer;

(e) etching the contact layer down to form a contact stripe such that the lateral regions of the cover layer are exposed and such that the active stripe lies in the shadow of the contact stripe;

(f) etching the transverse channels into the cover layer proceeding perpendicularly to the layers outside of the spacer layers and laterally of the active stripe and up to the lateral regions of the active layer with the assistance of a mask;

(g) etching the lateral regions of the active layer away up to the spacer layers with a selectively acting etchant; and (h) providing the laser diode with a structured metal contact on the side facing away from the substrate, the metal contact entirely covering the contact stripe and leaving the transverse channels open and allowing a contacting of the laser diode on contact surfaces outside of the region of the contact stripe.

The foregoing method may be modified in that the step (f) uses a structured metal contact that entirely covers the contact stripe and allows contacting of the laser diode on contacting surfaces outside of the region of the contact stripe as a mask and the step (h) is eliminated.

A method for manufacturing a preferred laser diode includes the steps of:

(a) successively epitaxially applying a buffer layer, an active layer, and a cover layer onto a structure, or non-planar, substrate;

(b) selecting the process perimeters such that the active layer grows only on the structure and next to the structure and not on the sidewalls of the structure when growing this active layer so that the active stripe and the lateral regions of the active layer are formed as a result thereof;

(c) applying a contact layer onto the cover layer;

(d) etching the contact layer down to form a contact stripe such that the lateral regions of the cover layer are exposed and such that the active stripe lies in the shadow of the contact stripe;

(e) etching the transverse channels into the cover layer perpendicularly relative to the layer structure outside of the active stripe with the assistance of a mask, being etched at least up to the lateral regions of the active layer;

(f) etching the lateral regions of the active layer with a selectively acting etchant that only attacks the material of the active layer and does not attack the material of the cover layer and of the buffer layer to produce lateral channels as a result thereof;

(g) providing the laser diode with a structured metal contact on the side facing away from the substrate, the structured metal contact entirely covering the contact stripe, leaving the transverse channels open, and allowing a contacting of the laser diode on the contacting surfaces outside of the region of the contacting stripe.

The foregoing method is further characterized by, in step (e), using a structured metal contact that entirely covers the contact stripe and then allows a contacting of the laser diode on contacting surfaces outside of the region of the contact stripe as a mask and eliminating the step (g).

A preferred embodiment of the laser diode provides a plurality of laser active stripes proceeding parallel next to one another with lateral channels.

The inventive structure of the laser diode contains a layer structure that enables lateral channels to be etched out parallel to the stripe of the active layer and to simultaneously leave the active stripe in the straight-line limitation prescribed by the mask technique. The idea is thereby to embed the active stripe in semiconductor material such that the manufacture of lateral channels for lateral current limitation can ensue without the risk that the respective active stripe will also be etched when the channels are etched. It should also be assured that this laser diode can be easily reproduced and, for example, that the laser-active stripe is defined in terms of its dimensions and in terms of its shape by a suitable mask technique and can no longer be modified by the following etching step. The invention shall be set forth below with reference to some exemplary embodiments and to the appertaining manufacturing methods.

DETAILED DESCRIPTION OF THE PREFERRED EMBODIMENTS

Figure 1:
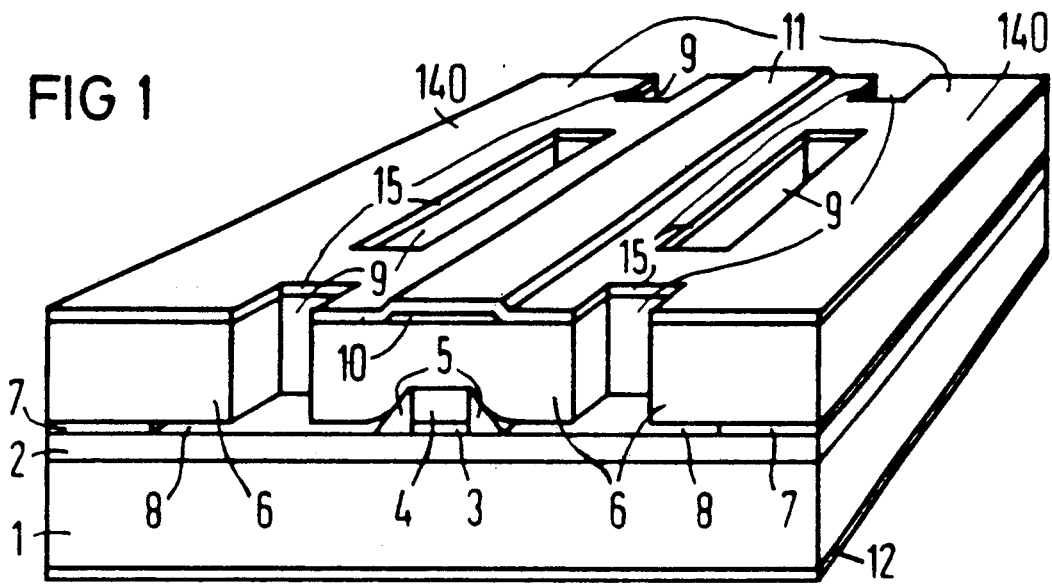
FIG. 1 shows an exemplary embodiment of a laser diode of the invention having spacer layers.

The description of the invention with reference to the exemplary embodiment shown in FIG. 1 now follows.

A substrate 1 composed of a first semiconductor material, for example, InP, having a first conductivity type is followed by a buffer layer 2 of the same material of the first conductivity type. A stripe-shaped, active layer 3 that for example, is composed of InGaAsp is grown on the buffer layer 2. This active stripe 3 is undoped or of the first or of a second conductivity type. The active stripe 3 is surrounded on all sides by layers composed of the first semiconductor material, for example, InP here.

An upper stripe 4 composed of the first semiconductor material, for example, InP, having a second conductivity type is grown on the active stripe 3. This upper stripe 4 has the same width as the active stripe 3. The sidewalls of the active stripe 3 and of the upper stripe 4 are covered by spacer layers 5 composed of the first semiconductor material, for example, InP. These spacer layers 5 are doped such that their specific resistance is high. It is thus assured that the electrical current flows essentially over the active stripe 3. The spacer layers 5 see to a lateral guidance of the light wave in the resonator of the laser diode. The spacer layers 5 can have a rectangular or triangular cross-section. It is beneficial for the current limitation to fashion the spacer layers 5 with a triangular cross-section. It is then guaranteed that the active stripe 3 is entirely laterally covered and that, at the same time, the cross-section across which a possible shunt current can flow is small. The spacer layers 5 touch the buffer layer 2 with one cathetus and touch the active stripe 3 and the upper stripe 4 with its other cathetus. The spacer layers 5 do not extend beyond the upper edge of the upper stripe 4.

The upper stripe 4 is followed surface-wide by a cover layer 6 composed of the first semiconductor material, for example, InP, having the second conductivity type. This cover layer 6 is connected to the buffer layer 2 at both sides of the active stripe 3 by ridges 7 that, for example, are composed of InGaAsP. Lateral channels 8 proceed between the cover layer 6 and the buffer layer 2. The lateral channels 8 proceed at both sides of the active layer 3 between the spacer layers 5 and the ridges 7. Transversal channels 9 are present in the cover layer 6 perpendicularly relative to the layer structure. The transversal channels 9 have a connection to the lateral channels 8.

A highly doped contact stripe 10 of, for example, InGaAs or InGaAsP of the second conductivity type follows on the cover layer 6 above the active stripe 3. This contact stripe 10 is arranged proceeding above the active stripe 3. A structured metal contact 11 follows above the contact stripe 10 and the cover layer 6. This structured metal contact 11 entirely covers the contact stripe 10 and the cover layer 6 and has recesses 15 in the region of the transversal channels 9. A connection of the middle and outer structures of the structured metal contact 11 is present outside the transversal channels 9. As a result thereof, the laser diode can be contacted at contacting surfaces 140 laterally of the region of the contact stripe 10. A large-area, further metal contact 12 is applied on that side of the substrate 1 facing away from the layer structure.

The highly doped contact stripe 10 is fundamentally dispensable; however, it considerably reduces the contact resistance in the region of the active stripe 3 and thereby produces an additional, lateral current limitation. This lateral current limitation can be further improved in that an oxide layer is deposited on the cover layer 6 outside of the region occupied by this contact stripe 10 and the structured metal contact 11 then follows on this oxide layer. It is a significant advantage of the laser diode of the invention that the transverse channels 9 occupy a relatively small region of the surface and that the structured metal contact 11 is applied surface-wide on semiconductor layers. The [recesses] 15 caused by the transverse channel 9 are relatively small, so that large contacting surfaces 140 derive that enable a contacting outside the region of the active stripe 3. A contacting in the region of the active stripe 3 has an unfavorable influence on the modulation behavior of a laser diode.

The spacer layers 5 are manufactured of a semiconductor material that is lightly doped and that is not attacked by the etchant that is used for etching the channels out.

Figure 2:
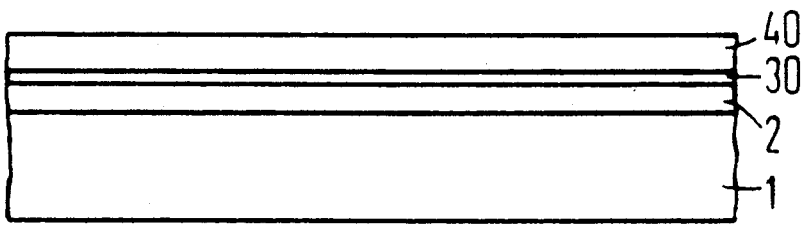
FIG. 2 shows the structure after the first epitaxy cycle in the manufacture of the laser diode shown in FIG. 1.
Figure 3:
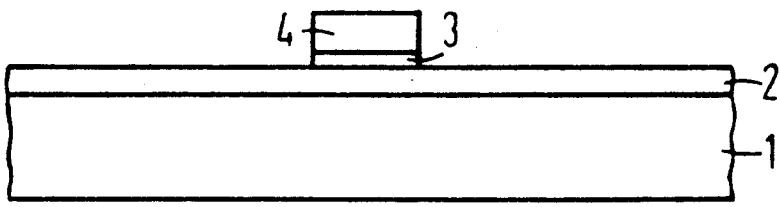
FIG. 3 shows the structure after the etching step following the first epitaxy cycle in the manufacture of the laser diode shown in FIG. 1.
Figure 4:
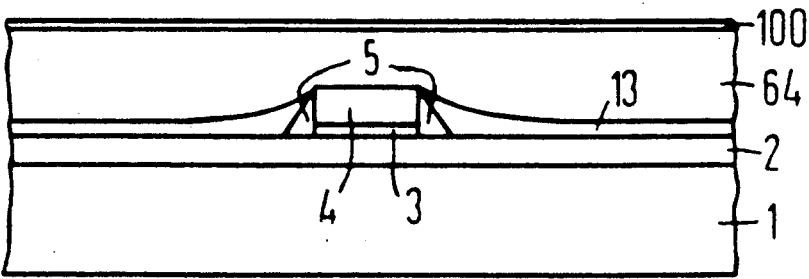
FIG. 4 shows the structure after the second epitaxy cycle in the manufacture of the laser diode shown in FIG. 1.

The manufacture of the laser diode illustrated in FIG. 1 shall be set forth with the assistance of FIGS. 2-4.

The buffer layer 2 composed, for example, of InP of the first conductivity type, an active layer 30 composed, for example, of InGaAsP and an upper layer 40 composed, for example, of InP of a second conductivity type are applied onto the substrate 1 composed, for example, of InP of a first conductivity type (FIG. 2). The active layer 30 and the upper layer 40 are etched with the assistance of a mask to form an active stripe 3 and an upper stripe 4 (FIG. 3).

In a further epitaxial step, lateral spacer layers 5 composed, for example, of InP are grown on the sidewalls of the active stripe 3 and of the upper stripe 4. The parameters in this epitaxial step are selected such that their spacer layers 5 grow mainly at the sidewalls of the active stripe 3 and of the upper stripe 4. The material of the spacer layers 5 is doped such that its specific resistance is high. An intermediate layer 13 composed, for example, of InGaAsP is grown onto the sidewalls of the spacer layers 5 and onto the buffer layer 2 at both sides of the spacer layers 5 such that it extends at most up to the upper edge of the upper stripe 4 and such that it leaves the upper side of the upper stripe 4 uncovered.

A cover layer 64 composed of, for example, of InP of the second conductivity type is grown onto the upper stripe 4 and onto the intermediate layer 13. The growth parameters are selected such that this cover layer 64 covers the upper stripe 4 and the intermediate layer 13 and such that the surface of this cover layer 64 is planar. A highly doped contact layer 100 composed of for example, of InGaAs or InGaAsP of the second conductivity type is grown onto the cover layer 64 (FIG. 4). This highly doped contact layer 100 is etched down with the assistance of a mask to form a contact stripe 10. A structured metal contact 11 is applied onto the cover layer 64 and onto the contact stripe 10. The structured metal contact 11 is realized such that it entirely covers the contact stripe 10, such that it contains contacting surfaces 140 at both sides of the surface outside of the region occupied by the contact stripe 10, these contacting surfaces 140 being conductively connected to the part that covers the contact stripe 10, and such that it comprises recesses 15 between the contacting surfaces 140 and the part covering the contact stripe 10, these recesses 15 partially exposing the surface of the cover layer 64. In the next step, the structured metal contact 11 is used as mask when etching transversal channels 9 into the cover layer 6. The transversal channels 9 are etched down to the intermediate layer 13. The intermediate layer 13 is partially etched off through the transversal channels 9 in the following step with a selectively acting etchant. The lateral channels 8 produced between the cover layer 6 and the buffer layer 2 by etching the intermediate layer 13 off extend up to the spacer layers 5. The spacer layers 5 are not attacked in this etching process; in particular, the active stripe 3 remains undamaged in this fashion. The intermediate layer 13 is etched away up to the spacer layers 5 and the upper edge of the upper stripe 4. Residues of the intermediate layer 13 form the ridges 7 at the sides of the laser diode with which the cover layer 6 is connected to the buffer layer 2 (FIG. 1). A large-area, further metal contact 12 is applied on that side of the substrate 1 facing away from the layer structure.

Figure 5:
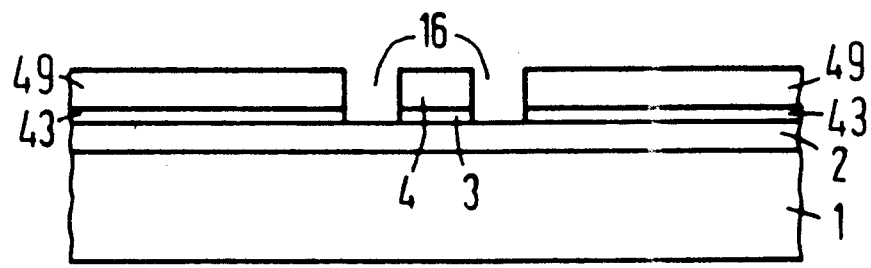
FIG. 5 shows the structure after the etching step following the first epitaxy cycle in the manufacture of the laser diode shown in FIG. 7.
Figure 6:
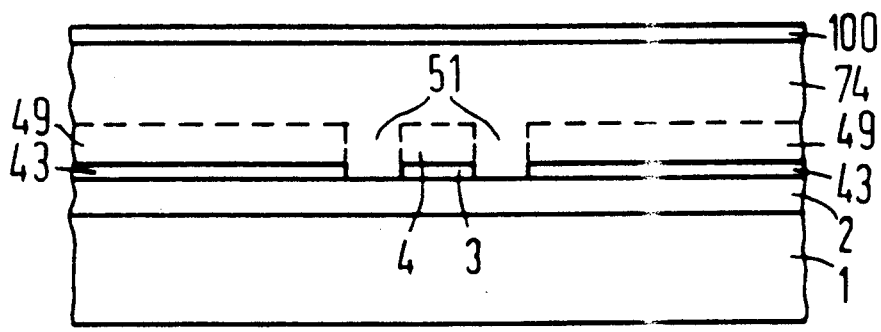
FIG. 6 shows the structure following the second epitaxy cycle in the manufacture of the laser diode shown in FIG. 7.
Figure 7:
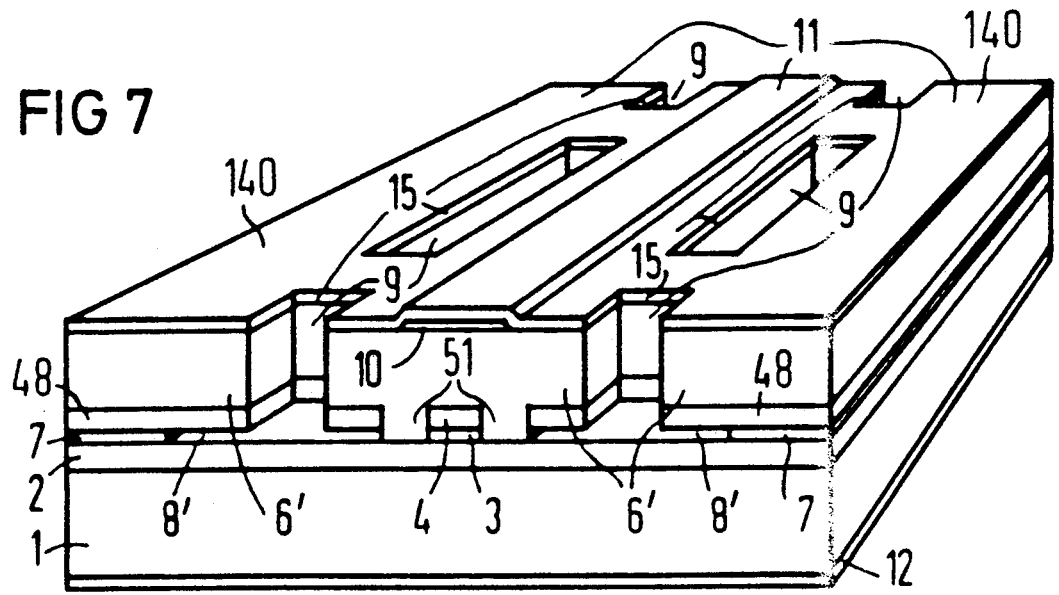
FIG. 7 shows an exemplary embodiment of a laser diode of the invention having spacer layers of the same material as the cover layer.

The manufacture of a further exemplary embodiment of the laser diode of the invention shown in FIG. 7 shall be set forth with the assistance of FIGS. 5-7. A description of the structure of the finished laser diode thus follows at the same time.

The manufacturing method departs from the basic structure shown in FIG. 2 that contains a substrate 1 composed, for example, of InP having the first conductivity type, a buffer layer 2 composed, for example, of InP having the first conductivity type, an active layer 30 composed, for example, of InGaAsP and an upper layer 40 composed, for example, of InP having the second conductivity type. Parallel trenches 16 are etched into the upper layer 40 and into the active layer 30 down to the buffer layer 2 with the assistance of a mask such that an active stripe 3 of the active layer 30 and, thereon, an upper stripe 4 of the upper layer 40 remain standing between them and such that lateral regions 43 of the active layer 30 and lateral regions 49 of the upper layer 40 remain standing outside the parallel trenches 16 (FIG. 5).

In the following step, the structure is covered with a cover layer 74, whereby the parallel trenches are filled up with spacer layers 51 and the cover layer 74 is grown over these spacer layers 51 together with the upper stripe 4 and the corresponding lateral regions 49. The cover layer 74 is composed, for example, of InP having the second conductivity type. A highly doped contact layer 100 that, for example, is composed of InGaAs or InGaAsP having the second conductivity type is grown onto the cover layer 74 (FIG. 6).

This highly doped contact layer 100 is etched off with the assistance of a mask such to form a contact stripe 10 that this contact stripe 10 proceeds above the active stripe 3 and such that the cover layer 6' is exposed outside of the region occupied by this contact strip 10 (FIG. 7). In the next step, the layer structure is provided with a structured metal contact 11 at that side facing away from the substrate. The structured metal contact 11 is shaped such that it entirely covers the contact stripe 10, such that it comprises recesses 15 outside of the region occupied by the active stripe 3 and by the spacer layers 51 and such that it enables a contacting on contacting surfaces 140 outside of the region of the contact stripe 10 (FIG. 7).

The structured metal contact 11 is used as mask in order to etch transversal channels proceeding perpendicularly relative to the layer structure into the cover layer 6' and in order to etch the lateral regions 49 of the upper layer 40 down to the lateral regions 43 of the active layer 30 outside of the active stripe 3 and outside of the spacer layers 51. The lateral regions 43 of the active layer 30 are etched away in inward direction up to spacer layers 51 with a selectively acting etchant through these transverse channels 9. Lateral channels 8' thereby arise. The ridges 7 limiting these lateral channels 8' are formed by those parts of the lateral regions 43 of the active layer 30 remaining after etching. The lateral regions 49 of the upper layer 40 are connected to the buffer layer 2 by the ridges 7 (FIG. 7). The laser diode is provided with a large-area, further metal contact 12 at the side of the substrate 11 facing away from the layer structure.

The structured metal contact 11 and the transverse channels 9 reduce the parasitic capacitances that occur during operation of the laser diode. The lateral channels 8' see to a lateral current limitation onto the region of the active stripe 3. The quality of the current limitation is thereby dependent on the width of the spacer layers 51. The material of the spacer layers is of such a nature that it is not attacked by the etchant used when etching out the lateral channels 8', so that the active stripe 3 retains its original, lateral limitation.

Figure 10:
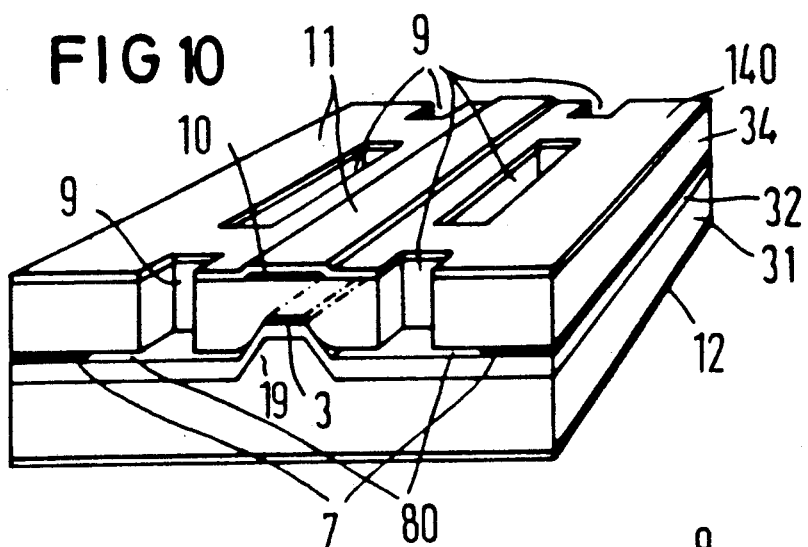
FIG. 10 shows an exemplary embodiment of a laser diode of the invention with a non-planar or structured substrate.
Figure 11:
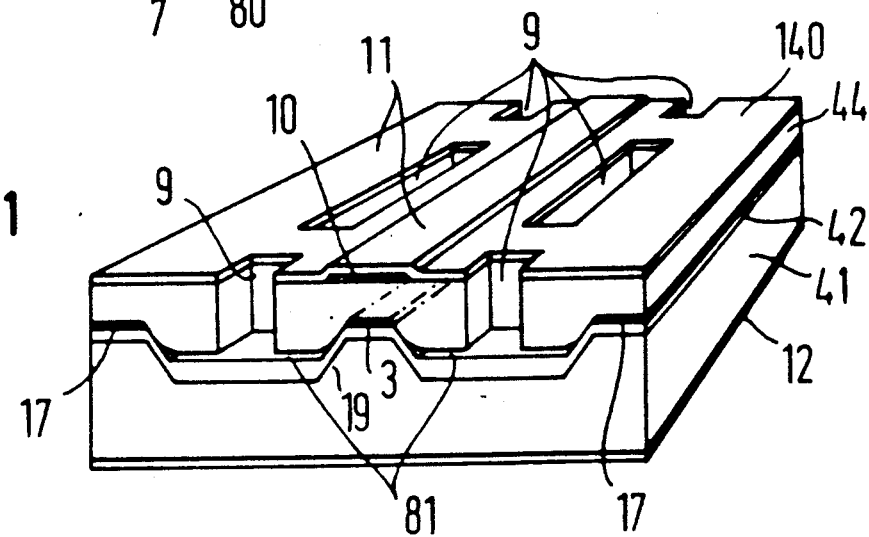
FIG. 11 shows a further exemplary embodiment of a laser diode of the invention with structured or non-planar substrate.
Figure 12:
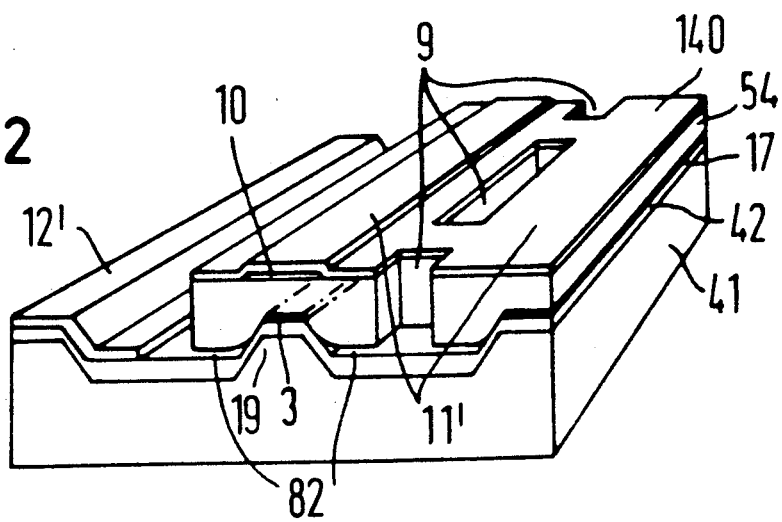
FIG. 12 shows an exemplary embodiment of a laser diode of the invention with structured or non-planar substrate of semi-insulating material.

Compared to the embodiments of the laser diode of the invention set forth up to now, the embodiments shown in FIGS. 10, 11 and 12 have the advantage that only one epitaxial cycle is required. Given manufacture in a plurality of epitaxial steps, the boundary surfaces such as for example, the boundary surfaces of the laser stripe that arise due to epitaxy in separate processes with intervening structuring deteriorate in quality. For this reason, it is recommendable to manufacture BH-laser diodes in only one epitaxial step. The manufacture of BH laser diodes in only one epitaxial cycle ensues upon employment of structured substrates. When growing the active layer, the growth parameters are selected such that the active layer grows on the structure of the substrate and next to the structure but not on the sidewalls thereof. In the laser diode of the invention, the substrate must be structured in such fashion that the sidewalls of the structure or, respectively, the semiconductor material grown thereon serve as a natural limitation for etching out lateral channels as lateral current limitation. In particular, the material of the active layer must differ such from the material of the substrate or, respectively, of the semiconductor layers grown thereon that the lateral regions of the active layer can be selectively etched. The material of the sidewalls of the structuring of the substrate dare not be attacked in this selective etching, so that it is assured that the active stripe retains the dimensioning established by the structuring of the substrate and the lateral limitation thereof cannot change due to the formation of the lateral channels.

The description of the exemplary embodiments shown in FIGS. 10-12 now follows.

The buffer layer 32, 42 is grown on a structured or non-planar substrate 31, 41 having at least one ridge, or gate, 19. The active stripe 3 proceeds on the gate 19. Ridges 7, 17 proceed at the edges of the component. Lateral channels 80, 81, 82 are fashioned between the gate 19 having the active strip 3 and the outer ridges 7, 17. The laser diode is planarized, or is given a planar surface, in an upward direction with a cover layer 34, 44, 54. A contact stripe 10 of highly doped material proceeds over the active stripe 3 in order to reduce the contact resistance. Transverse channels 9 are also present here, these being dimensioned as required for etching out the lateral channels 80, 81, 82 but being kept as small as possible. The entire surface of the semiconductor layer sequence is covered with a structured metal contact 11 that comprises recesses over the transversal channels 9 and comprises contacting surfaces 140 outside of the region occupied by the contact stripe 10.

All described embodiments can be constructed with a substrate of semi-insulating material. In this case, only the buffer layer 42 is grown surface-wide. Outside of the region occupied by the active stripe 3 and by the structure elements required for the lateral current limitation, at least one side of the buffer layer is directly occupied with a further metal contact 12' on its upper side. Only that region of the surface of the laser diode that is not occupied by this further metal contact 12' is then planarized with the cover layer 57. When the substrate is of conductive material, the further metal contact 12 is applied surface-wide on that surface of the substrate 31, 41 that faces away from the layer structure.

Details of the structure of this exemplary embodiment of the laser diode of the invention proceed from the following description of the manufacturing method.

A substrate 21, 31 composed of a highly conductive semiconductor material such as for example, n-doped InP or a substrate 41 composed of a semi-insulating semiconductor material, i.e. a semiconductor material having high specific resistance is employed. A stripe-shaped structure is produced on the surface of the substrate 21, 31 by etching. This structure can be composed of a gate 19 (FIG. 8) or of a trench 18 (FIG. 9) that is shown here having a V-shaped cross-section. A buffer layer 22, 32 that is composed of semiconductor material having the first conductivity type, for example, of n-doped InP is epitaxially grown onto the surface of the substrate 21, 31 structured in this fashion. The structuring of the substrate 21, 31 is thereby essentially preserved. An active layer 30 is epitaxially grown onto this buffer layer 22, 32. This active layer 30 is composed of a second semiconductor material having smaller energy band gap and higher refractive index than the material of the buffer layer 22, 32, for example, of InGaAsP. The dimensions and shape of the substrate structure are selected such that, given appropriate selection of the process parameters, the active layer 30 grows as active stripe 3, 3' on the structuring, i.e. on the gate 19 or, respectively, in the trench 18, and on lateral regions 23, 33. There are stripe-shaped regions on the sidewalls of the structure in which the buffer layer 22, 32 is not covered by the active layer 30. The lateral regions 23, 33 of the active layer 30 are thus not continuous with the active stripe, 3, 3'. Achieving that the active layer 30 grows as described above on the basis of a suitable selection of the growth parameters is possible in gas phase epitaxy, in molecular beam epitaxy as well as in liquid phase epitaxy.

A semiconductor layer has cover layer 14, 24 composed of the same semiconductor material as the buffer layer 22, 32 and having the second conductivity type, for example, p-doped InP, is epitaxially grown onto the active layer 30. The surfaces of the active layer 30 and the buffer layer 22, 32 that was not overgrown on the sidewalls of the structuring are thereby completely covered. The layer structure with index guidance that is standard for BH-lasers thereby derives. A contact layer is applied onto the cover layer 14, 24 that plane arises the laser diode and this contact layer is etched down with the assistance of a mask to form a contact stripe 10 that proceeds above the active stripe 3, 3'. This contact stripe 10 is so highly doped that it reduces the contact resistance in the region of the active stripe 3, 3'. The structure of FIG. 8 or, respectively, of FIG. 9 thus derives.

Figure 8:
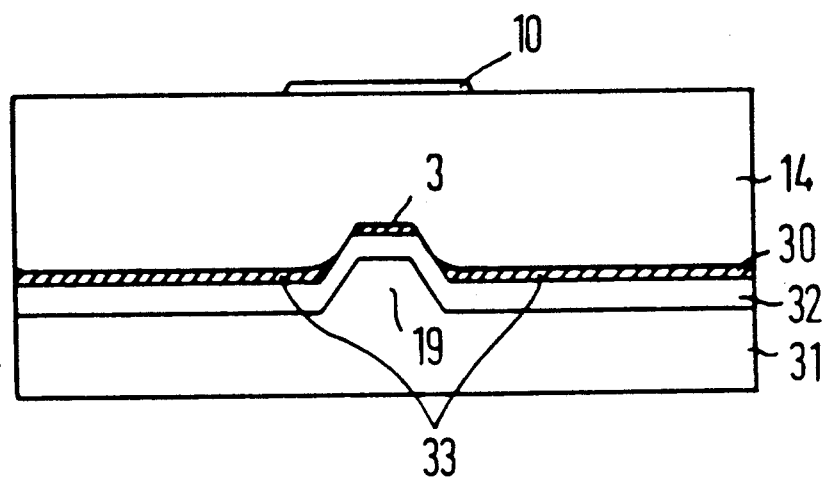
FIG. 8 shows the structure before the etching of the lateral channels in the manufacture of the laser diode shown in FIG. 10.
Figure 9:
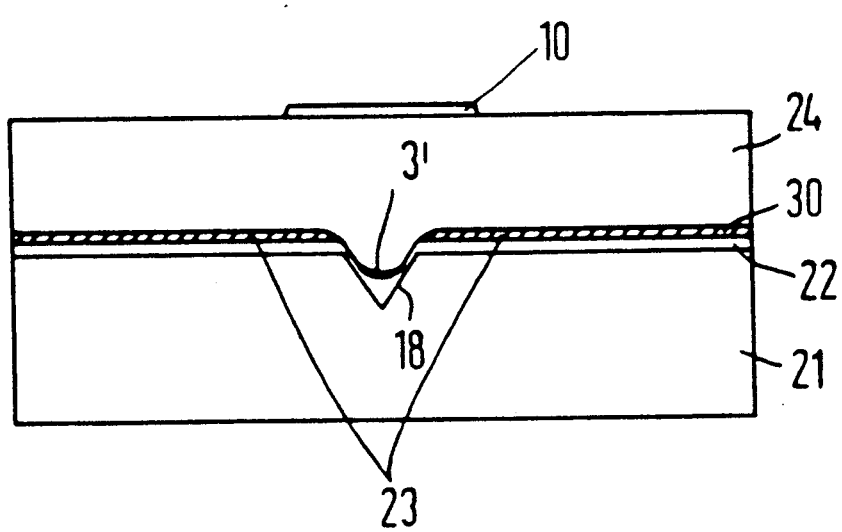
FIG. 9 shows an alternative structure to that of FIG. 8.

The method steps that lead from the sub-structure of FIG. 8 to the structure of FIG. 10 follow: First, transverse channels 9 are etched into the cover layer 14 with the assistance of a mask outside the region occupied by the structuring of the substrate. These transverse channels 9 extend at least to the lateral regions 33 of the active layer 30. However, they can also be etched into the buffer layer 32. This etching step can ensue wet-chemically or with ion etching, as usual. Through these transverse channels 9, lateral channels 80 at the side of the ridge 19 overgrown with the active stripe 3 are produced by partially etching out the lateral regions 33 of the active layer 30 with a selectively acting etchant that only dissolves the material of the active layer 30 and does not attack the material of the buffer layer 32 and of the cover layer 34. These lateral channels 80 are laterally limited by the sidewalls of the ridge 19 and by the residues of the lateral regions 33 of the active layer 30 that remain as ridges 7. The buffer layer 32 is thus exposed at the sidewalls of the ridge 19. The width of the ridges 7 is defined by the etching duration. Since the material of the buffer layer 32 and of the cover layer 34 are not attacked by the etchant, the etching can be continued until the ridges 7 are lent the prescribed width. The active stripe 3 remains undamaged in this etching process. In particular, the lateral limitations of the active stripe 3 remain in that condition defined in the process of growth.

In order to avoid surface currents and in order to protect the semiconductor surfaces against mechanical damage, it is advantageous to coat the walls of the lateral channels 80 and the walls of the transverse channels 9 with an electrically insulating material, for example with $SiO_2$, $Al_2O_3$ or the like. It is also possible to fill the lateral channels 80 and the transverse channels 9 up with an electrically insulating material.

Finally, a large-area, further metal contact 12 is applied on that side of the structured substrate 31 facing away from the layer structure. A structured metal contact 11 is applied onto the free surface of the semiconductor layer structure. The structured metal contact 11 has openings in the region of the transverse channels 9 and is shaped such that a contacting of the laser diode is possible on contacting surfaces 140 outside of the region occupied by the contact stripe 10. It has been shown, namely, that it has an unfavorable influence on the operating behavior of the laser diode when the laser diode is contacted above the active stripe.

FIG. 11 shows an exemplary embodiment wherein the edges of the substrate 41 proceeding parallel to the ridge 19 that carries the active stripe 3 are likewise provided with such burrs. When growing the active layer 30, an active stripe 3 on the middle ridge 19 and lateral ridges 17 as well as the lateral regions 33 thus derive. No material of the active layer has been or, respectively, is grown on the respective sidewalls of the structured substrate 41. This structure has the advantage that the etching process when etching the lateral channels 81 can be continued until the entire material of the lateral regions 33 of the active layer 30 is etched away. This structure is completely reproducible in an especially easy way. Both the width of the active stripe 3 as well as the width of the outer ridges 17 are preserved.

In the manufacture of the laser diode of the invention, the structured metal contact can be employed as mask for etching the transverse channels 9. The structured metal contact 11 with the corresponding openings is then applied onto the cover layer 14 before the etching of the transverse channels 9. Constructing the laser diodes on a semi-insulating substrate 41 and application of both metal contacts onto the surface of the layer structure facilitates the integration of the laser diode in a larger module. It is also possible in the last-described exemplary embodiments to improve the lateral current limitation with oxide layers laterally of the contact stripe 10 between the cover layer 34 and the structured metal contact 11. Manufacturing the laser diode in only one epitaxial cycle is advantageous in view of the useful life.

The structure of the laser diode of the invention is not limited to the described embodiments, but covers all executions wherein lateral current limitation with laterally proceeding channels and a lateral limitation of the active stripe are provided for protection against the chemical substances used during etching. Embodiments that respectively contain one active stripe are described here. The invention, of course, covers all embodiments wherein, for example, a plurality of laser-active stripes that proceed parallel to one another and that may potentially be coupled to one another are present and these active stripes are respectively provided with lateral channels in the structure of the invention.

I claim:

1. A laser diode of a buried double heterostructure that uses lateral current limitation, comprising:
    a substrate;
    a buffer layer on said substrate;
    a cover layer;
    at least one laser-active stripe between said buffer layer and said cover layer;
    metal contacts on said laser diode to drive said laseractive stripe;
    lateral, etched channels provided laterally of said laseractive stripe and proceeding parallel thereto;
    a semiconductor material laterally limiting said laseractive stripe; and the lateral limitation of said laser-active stripe proceeds as straight-line as possible upon employment of semiconductor layers manufactured with a mask technique.

2. A laser diode according to claim 1, wherein the semiconductor material that laterally limits said laser-active stripe comprises spacer layers;
    the lateral channels are fashioned in a semiconductor material that is grown laterally adjacent said spacer layers in an outward direction from said spacer layers; and
    the spacer layers are of a semiconductor material that is not attacked by at least one substance employable for the selective etching of the semiconductor material in which the lateral channels are fashioned.

3. A laser diode according to claim 2, wherein said substrate and the buffer layer are composed of a first semiconductor material and an upper stripe is applied on said at least one laser active stripe; said spacer layers completely cover sidewalls of said laser-active stripe and are applied onto the sidewalls of every one of said at least one laser active stripe and of an appertaining one of said upper stripe; in that said lateral channels that proceed parallel to said laser-active stripe are etched out laterally adjacent to the spacer layers; ridges at outside limits of said lateral channels; said cover layer forming a planar top surface of said laser diode, a contact stripe applied above said at least one laser-active stripe; and in that said metal contacts include a structured metal contact that covers the surface of said contact stripe and of the cover layer is covered with a structured metal contact and that includes at least one contacting surface outside of a region occupied by the contact stripe.

4. A laser diode according to claim 3, wherein the spacer layers are composed of the same semiconductor material as the cover layer.

5. A layer diode according to claim 3, wherein the spacer layers extend at most up to an upper boundary of the upper stripe.

6. A laser diode according to claim 1, wherein said substrate is non-planar having structuring, said laser-active stripe being formed by exploitation of the structuring of said substrate as an active layer is grown in such fashion that said active layer is fashioned as said laser-active stripe proceeding along the structuring of the substrate and is fashioned with lateral regions separated therefrom;
    in that the semiconductor material that laterally limits said laser-active stripe is semiconductor material of the cover layer;

in that the cover layer is composed of semiconductor material that is not attacked by at least one substance employable for selective etching of the semiconductor material in which the lateral channels are formed; and in that the lateral channels are formed in these said lateral regions of the active layer.

7. A laser diode according to claim 6, wherein the buffer layer, said laser-active layer and the cover layer are applied onto the non-planar substrate; in that said laser-active layer is formed as the at least one active stripe on the structuring of the substrate and as the lateral regions so that sidewalls of the structuring are not covered; in that the lateral channels extend up to the sidewalls of the structuring and are formed laterally of every one of said at least one active stripe; in that at least one part of said lateral channels are outwardly limited by said ridges; in that the laser diode is planarized with the cover layer; in that the contract stripe is applied above every one of said at least one active stripe; and in that a surface of the contact stripe and of the cover layer is provided with a structured metal contact that comprises at least one contacting surface outside of a region occupied by the contact stripe.

8. A laser diode according to claim 6, wherein the structuring of the substrate is at least one trench.

9. A laser diode according to claim 6, wherein the structuring of the substrate is at least one ridge.

10. A laser diode according to claim 1, wherein the substrate is composed of a semiinsulating material; in that the buffer layer is provided with a further metal contact in a lateral region that lies outside of the region occupied by the laser-active stripe and that is left free by the cover layer.

* * * * *